United States Patent
Gnat et al.

(10) Patent No.: US 7,224,627 B2
(45) Date of Patent: May 29, 2007

(54) INTEGRATED SEMICONDUCTOR CIRCUIT AND METHOD FOR TESTING THE SAME

(75) Inventors: Marcin Gnat, Mering (DE); Aurel von Campenhausen, Cluvenhagen (DE); Joerg Vollrath, Olching (DE); Ralf Schneider, München (DE)

(73) Assignee: Infineon Technologies AG, Munich (DE)

( * ) Notice: Subject to any disclaimer, the term of this patent is extended or adjusted under 35 U.S.C. 154(b) by 174 days.

(21) Appl. No.: 11/100,617

(22) Filed: Apr. 7, 2005

(65) Prior Publication Data

US 2005/0225917 A1    Oct. 13, 2005

(30) Foreign Application Priority Data

Apr. 7, 2004    (DE)    ...................... 10 2004 017 284

(51) Int. Cl.
G11C 7/00    (2006.01)
(52) U.S. Cl. ................. 365/201; 365/189.09; 365/226; 365/189.07
(58) Field of Classification Search ................ 365/201, 365/189.09, 226, 189.07
See application file for complete search history.

(56) References Cited

U.S. PATENT DOCUMENTS

| | | | |
|---|---|---|---|
| 5,150,188 A | 9/1992 | Hara et al. | |
| 5,642,073 A | 6/1997 | Manning | |
| 5,708,420 A | 1/1998 | Drouot | |
| 6,052,321 A * | 4/2000 | Roohparvar | 365/201 |
| 6,111,737 A | 8/2000 | Baldwin et al. | |
| 6,707,737 B2 * | 3/2004 | Tanizaki | 365/201 |
| 2002/0041531 A1 | 4/2002 | Tanaka et al. | |
| 2003/0141890 A1 | 7/2003 | Hartmann | |

FOREIGN PATENT DOCUMENTS

| | | |
|---|---|---|
| DE | 3835863 | 7/1990 |
| DE | 10101997 | 2/2003 |
| JP | 11096796 | 4/1999 |

* cited by examiner

Primary Examiner—Richard T. Elms
Assistant Examiner—N Nguyen
(74) Attorney, Agent, or Firm—Edell, Shapiro & Finnan, LLC

(57) ABSTRACT

Integrated semiconductor circuits, in particular, dynamic random access memories include a multiplicity of generator circuits for generating internal voltage levels from an externally applied supply voltage. During testing, the internal voltage levels are altered by the output voltage generated at the output of the generator circuit being adapted to an externally applied test voltage. If the test voltage is outside a tolerance range, the semiconductor circuit maybe destroyed. A protection circuit connected in parallel with the generator circuit limits the output voltage.

9 Claims, 5 Drawing Sheets

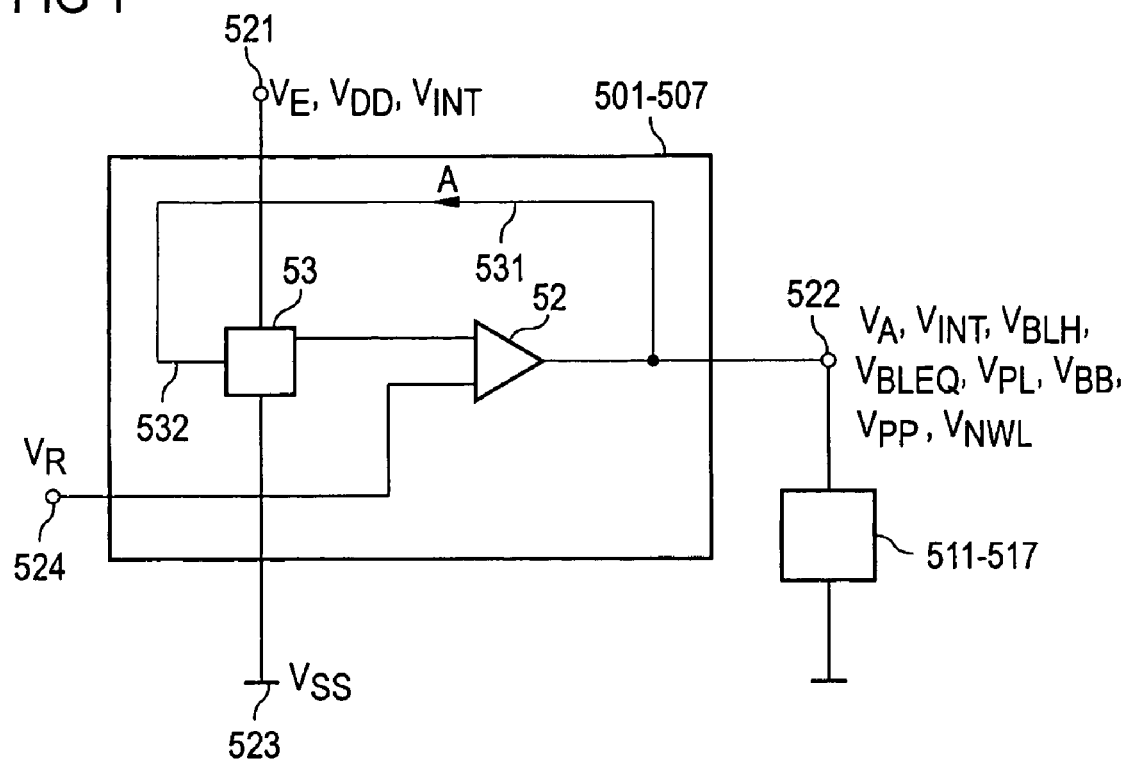

INTEGRATED SEMICONDUCTOR CIRCUIT AND METHOD FOR TESTING THE SAME

CROSS REFERENCE TO RELATED APPLICATIONS

This application claims priority under 35 USC §119 to German Application No. DE 10 2004 017 284.6, filed on Apr. 7, 2004, and titled "Integrated Semiconductor Circuit and Method for Testing Integrated Semiconductor Circuits," the entire contents of which are hereby incorporated by reference.

FIELD OF THE INVENTION

This invention relates to an integrated semiconductor circuit with a generator circuit for generating an internal voltage level from an externally applied supply voltage, and to a method for testing a multiplicity of integrated semiconductor circuits with an altered internal voltage level.

BACKGROUND

Modern integrated semiconductor circuits require a multiplicity of internal voltage levels for the operation of subcircuits and individual components. The internal voltage levels are intended to have a previously defined, temporally constant value and may be either positive or negative relative to a reference potential or a ground of the integrated semiconductor circuit.

To ensure a simple voltage supply of the integrated semiconductor circuit by a single external power source, the internal voltage levels required for the operation of the subcircuits and components are generally generated from a single, preferably positive, supply voltage applied externally to the integrated semiconductor circuit.

For example, a dynamic semiconductor memory with random access, a so-called DRAM (dynamic random access memory), contains, as subcircuits and components to be operated, an array of memory cells, a plurality of word lines, a plurality of bit lines, and an address decoder for selection of one of the memory cells based on an address by selection of one of the word lines and one of the bit lines. Each of the memory cells has a selection transistor with a control terminal and a controlled path and a storage capacitor with an electrode having a capacitance with respect to a conductive plate buried in the substrate. The control terminal of the selection transistor is connected to one of the word lines and the electrode of the storage capacitor is connected to one of the bit lines via the controlled path of the selection transistor.

For operation of the dynamic semiconductor memory with random access, one or a plurality of the following internal voltage levels, in particular, are generated from an externally applied supply voltage $V_{DD}$, for example, of preferably 3.3 V, an internal supply voltage of, for example, 2.5 V for supplying the address decoder, a negative substrate bias voltage $V_{BB}$ of, for example, −1.3 V as bias voltage for the semiconducting substrate in order to suppress leakage currents, a plate voltage $V_{PL}$ of, for example, 0.9 V as bias voltage for a conductive plate buried in the substrate, an equalize voltage $V_{BLEQ}$ of, for example, 0.9 V for setting a reference charge on a bit line, a high voltage level $V_{BLH}$ of, for example, 1.8 V for writing to a memory cell, a negative switch-off voltage $V_{NWL}$ of, for example, −0.5 V as negative bias voltage of the word lines, and a switch-on voltage $V_{PP}$ of, for example, 3.5 V for a word line selected by the address decoder.

After fabrication an integrated semiconductor circuit is generally subject to a comprehensive functional test under various operating conditions. For example, the functional test for a semiconductor memory with random access include selecting a memory cell based on an address, writing information items to the selected memory cell, reading information items from the selected memory cell, and comparing the written and read information items. In this case, the same memory cells are accessed in a different order, in particular, in order to find malfunctions that depend on the access order.

The operating conditions are varied while the functional test is carried out. In particular, the ambient temperature of the integrated semiconductor circuit is increased by introducing it into a furnace. Moreover, the internal voltage levels required for operation of the subcircuits and components are altered. For this purpose, the integrated semiconductor circuit is connected to an automatic test machine which sets the internal voltage levels to previously defined test values by applying test voltages to terminals provided for this. In this case, the test values for the internal voltage levels are deliberately chosen such that the integrated semiconductor circuit is exposed to a stress that has been increased in a targeted manner. However, unfavorable operating conditions may lead to undesired damage to or destruction of components due to overstress. For example, as a result of incorrect programming of the automatic test machine, internal voltage levels outside a tolerance range around an envisaged value may be generated, which leads to destruction of the integrated semiconductor circuit.

To avoid such overstress, to prevent the integrated semiconductor circuit from being destroyed as a result of an erroneous predefinition of test voltages by the automatic test machine, is desirable.

SUMMARY

An integrated semiconductor circuit includes a circuit arrangement for limiting an internal voltage level. Such integrated semiconductor circuit includes a generator circuit with a reference terminal for applying a reference potential, an input for applying an input voltage, and an output for tapping off an output voltage set by predefining a value for a reference voltage. The integrated semiconductor circuit also includes a protection circuit connected between the output and the reference terminal of the generator circuit for limiting the output voltage.

The protection circuit is connected downstream of each voltage generator of an integrated semiconductor circuit which generates an internal voltage level from a supply voltage applied externally to the integrated semiconductor circuit. The protection circuit permits the settable output voltage of the generator circuit to be altered only within a defined tolerance range. This prevents the integrated semiconductor circuit from being destroyed in the context of a functional test as a result of a test value of the output voltage that lies outside the tolerance range being set.

The protection circuit, for example, includes a switching element, which has a controllable current path that is conducting if the output voltage is greater than a predefined threshold voltage. If the current path is conducting, then the output current of the generator circuit increases, which results in the output voltage being limited due to an increase in the voltage drop across the internal resistance of the generator circuit. This in turn increases the power consumption of the integrated semiconductor circuit, which, as explained below, is ascertained externally.

The generator circuit, for example, includes a terminal for predefining the value of the reference voltage for the output voltage of the generator circuit. The output voltage is generated at the output of the generator circuit. In the context of testing an integrated semiconductor circuit, different predefined values for the output voltage of the generator circuit are applied via this terminal. After applying one of the predefined values, the output voltage generated by the generator circuit is matched to the predefined value and a functional test is conducted.

The protection circuit, for example, includes a number of series-connected and forward-biased diodes. The output voltage of the generator circuit is limited by the sum of the threshold voltages of the diodes. A part of the output voltage of the generator circuit is dropped across each diode of the series circuit. As long as the voltage drop across a diode is less than the threshold voltage of the diode, the diode is in the off state. By contrast, if the voltage drop is greater than the threshold voltage of the diode, the diode is in the on state. As soon as one of the diodes of the series circuit is turned on, almost no more voltage is dropped across it and the voltage drop across each of the remaining diodes increases. If the threshold voltages of the diodes of the series circuit differ only relatively slightly, the series circuit therefore abruptly becomes conducting as soon as the voltage drop per diode brought about by the output voltage of the generator circuit exceeds the threshold voltage of the diode.

The protection circuit, for example, includes a voltage divider with a tapping terminal. A differential amplifier with a first input, connected to the tapping terminal of the voltage divider, a second input applied by a generator for a defined reference voltage, an output, and a transistor with a control terminal, which is connected to the output of the differential amplifier, and a controlled path connected between the output of the generator circuit and the reference terminal of the generator circuit. The voltage divider is connected between the output of the generator circuit and the reference terminal of the generator circuit. In this case, the controlled path of the transistor is switched to the conducting state by the differential amplifier, if the voltage tapped off at the voltage divider is greater than the defined reference voltage. The differential amplifier thus compares that part of the output voltage of the generator circuit, which is tapped off at the tapping terminal of the voltage divider with the defined reference voltage and turns the transistor on if the output voltage of the generator circuit exceeds a threshold voltage predefined by the defined reference voltage and the ratio of the component resistances of the voltage divider.

The protection circuit, for example, includes a field effect transistor with a control terminal and a controlled path. The controlled path of the transistor is controlled between the output of the generator circuit. The reference terminal of the generator circuit and the control terminal is connected to the reference terminal of the generator circuit. In the case of this arrangement, the field effect transistor is operated as a breakdown diode, which is turned on above a threshold voltage determined by the channel width of the field effect transistor.

The integrated semiconductor circuit, for example, includes a terminal for an external power source. The terminal has a positive voltage relative to the reference potential of the semiconductor circuit. The positive voltage is the supply voltage which is applied externally to the integrated semiconductor circuit and from which all internal voltage levels are generated.

The input of the generator circuit is, for example, connected to the terminal for the external power source. In this case, the output voltage of the generator circuit generated at the output of the generator circuit is derived directly from the supply voltage applied externally to the integrated semiconductor circuit.

The integrated semiconductor circuit, for example, includes an additional generator circuit with an input and an output. The input of the additional generator circuit is connected to a terminal for the external power source and the input of the generator circuit is connected to the output of the additional generator circuit. In this case, the output voltage of the generator circuit generated at the output of the generator circuit is not derived directly from the supply voltage applied externally to the integrated semiconductor circuit, but rather from the output voltage of the additional generator circuit. Thus, a circuit for stabilizing the output voltage with respect to fluctuations of the input voltage is provided in the additional generator circuit. The input voltage of the circuit is the supply voltage applied externally to the integrated semiconductor circuit. By contrast, the input voltage of the generator circuit has a stable voltage level, so that the generator circuit has circuits for converting the internal voltage level given by the input voltage to the internal voltage level given by the output voltage.

The generator circuit, for example, includes a voltage pump designed such that the output voltage of the generator circuit is higher than the input voltage of the generator circuit. A generator circuit with a voltage pump has a plurality of capacitors and a clock-controlled switching logic, which alternately connects up the capacitors to form a parallel circuit and to form a series circuit and ensures that the parallel circuit of the capacitors is always connected between the input of the generator circuit and the reference terminal of the generator circuit and the series circuit of the capacitors is always connected between the output of the generator circuit and the reference terminal of the generator circuit.

The generator circuit, for example, includes a voltage pump designed such that the output voltage of the generator circuit is negative relative to the reference potential. With such a generator circuit, the voltage pump has a capacitor and a clock-controlled switching logic, which alternately connects the capacitor between the input of the generator circuit and the reference terminal of the generator circuit and between the output of the generator circuit and the reference terminal of the generator circuit, and ensures that the polarity of the capacitor is in each case interchanged between these switching processes.

The semiconductor circuit, for example, includes a substrate. The output of the generator circuit is connected to the substrate and has a negative bias voltage relative to the reference potential. This negative bias voltage of the substrate suppresses leakage currents between components formed in the substrate and the substrate.

The integrated semiconductor circuit, for example, includes a memory cell array designed for random access to one or a plurality of memory cells, which has a selection transistor and a storage capacitor. In this case, the memory cells are connected to the output of the generator circuit such that the generator circuit supplies an electrode of the one storage capacitor with a reference voltage. For example, trench capacitor cells are formed in a p-conducting substrate, and the n-conducting external electrode of the trench capacitor cells are electrically conductively connected via an n-conducting plate buried in the substrate. This n-conducting plate buried in the substrate is connected to a reference voltage of, for example, 0.9 V.

The integrated semiconductor circuit, for example, includes a memory cell array designed for random access to one or a plurality of memory cells arranged in rows and columns, a plurality of word lines, and a plurality of word line drivers. A respective one of the rows of memory cells is connected to a respective one of the word lines. The respective one of the word lines is connected to a respective one of the word line drivers and the respective one of the word line drivers is connected to the output of the generator circuit.

Preferably the respective one of the word lines is connected to a switch-on voltage generated by the generator circuit, for the purpose of opening the respective one of the rows of memory cells. In this case, the generator circuit supplies the respective one of the word line drivers with the switch-on voltage for the respective one of the word lines and the word line driver forwards the switch-on voltage to the word lines as required.

Preferably, the respective one of the word lines is connected to a switch-off voltage generated by the generator circuit, for blocking the respective one of the rows of memory cells. In this case, the generator circuit generates the switch-off voltage for the respective one of the word lines.

The switch-off voltage is, for example, negative relative to the reference potential. In this case, the generator circuit for generating the switch-off voltage has a voltage pump.

The semiconductor circuit, for example, includes a memory cell array designed for random access to one or a plurality of memory cells arranged in rows and columns, a plurality of word lines, and a word line decoder for selecting of one of the word lines based on a row address. A respective one of the rows of memory cells is connected to a respective one of the word lines. The word line decoder is connected to the output of the generator circuit such that the generator circuit supplies the word line decoder with an internal voltage. In this case, the generator circuit for generating the internal voltage has subcircuits for stabilizing the internal voltage with respect to fluctuations of the supply voltage applied externally to the integrated semiconductor circuit.

The integrated semiconductor circuit, for example, includes a memory cell array designed for random access to one or a plurality of memory cells arranged in rows and columns, a plurality of bit lines, and an equalize circuit. A respective one of the columns of memory cells is connected to a respective one of the bit lines. At least two of the bit lines are connected to the equalize circuit and the equalize circuit is connected to the output of the generator circuit such that the generator circuit supplies at least two of the bit lines with a precharge voltage for setting a reference charge. This reference charge is set each time before one of the memory cells of the at least two of the bit lines is accessed. It is respectively ensured that only a single one of the memory cells of the at least two of the bit lines is accessed. When the single one of the memory cells is accessed, the bit line connected to the memory cell is connected to an electrode of the storage capacitor of the memory cell and charge flows between the bit line and the electrode of the storage capacitor until the bit line and the electrode have the same voltage.

The integrated semiconductor circuit, for example, includes a memory cell array designed for random access to one or a plurality of memory cells arranged in rows and columns, a plurality of bit lines, and a sense amplifier. A respective one of the columns of memory cells being connected to a respective one of the bit lines. At least two of the bit lines are connected to the sense amplifier and the sense amplifier is connected to the output of the generator circuit and to the reference potential such that one of the at least two bit lines can be connected to a high voltage for storing a first logic state and to the reference potential for storing a second logic state. The sense amplifier compares the voltages of the at least two connected bit lines in a time-controlled manner, applies the high voltage to those of the bit lines which have a higher voltage, and applies the reference potential to those of the bit lines which have a lower voltage.

The integrated semiconductor circuit, for example, includes a memory cell array designed for random access to one or a plurality of memory cells arranged in rows and columns, a plurality of bit lines, and a bit line decoder for selecting one of the bit lines based on a column address. A respective one of the columns of memory cells is connected to a respective one of the bit lines. The output of the generator circuit is connected to the bit line decoder such that the generator circuit supplies the bit line decoder with an internal voltage. In an expedient manner, the generator circuit for generating the internal voltage for the bit line decoder also supplies a word line decoder for selecting word lines based on the row addresses.

The integrated semiconductor circuit, for example, includes a memory cell array, which has memory cells with a selection transistor and a storage capacitor and is designed for random access to one or a plurality of memory cells, a semiconducting substrate, and an electrode plate buried in the substrate. The storage capacitor includes a trench formed in the substrate and an electrode of the storage capacitor is formed in the trench.

A positive voltage relative to the reference potential is, for example, applied to the buried electrode plate by the generator circuit. The electrode of the storage capacitor of a memory cell has a higher or lower voltage in comparison with the positive voltage in a manner dependent on a logic state stored in the memory cell.

The semiconductor circuit, for example, includes a selection transistor. A control terminal of the selection transistor is connected to a gate conductor. The controlled path of the selection transistor has a channel running between a source region. The output voltage of the generator circuit is applied to the gate conductor. The output voltage is higher than a voltage of an external power source. The generator circuit also has a charge pump.

A method for testing a multiplicity of integrated semiconductor circuits which, prior to carrying out a functional test for a semiconductor circuit chosen from the multiplicity of integrated semiconductor circuits, permits an internal voltage level of the selected semiconductor circuit to be altered, but avoids destruction of the selected semiconductor circuit by overstressing.

A method for testing a multiplicity of integrated semiconductor circuits, includes:

a) providing a multiplicity of integrated semiconductor circuits each having a generator circuit and a protection circuit, and an automatic test machine, b) connecting the multiplicity of integrated semiconductor circuits to the automatic test machine, c) predefining a value of the reference voltage for the multiplicity of semiconductor circuits by the automatic test machine, d) generating an output voltage dependent on the value of the reference voltage by a generator circuit of the multiplicity of semiconductor circuits, e) switching a current path contained in the protection circuit to the conducting state if the output voltage exceeds a predetermined threshold value, in order to limit the output voltage of the generator circuit, f) measuring a power consumption of the semiconductor circuits, g) predefining a smaller-magnitude value of the reference voltage and repeating steps d) to f) if the measured power consumption is higher than a predefined threshold value, and h) conducting a functional test for the multiplicity of semiconductor circuits.

The functional test for the multiplicity of integrated semiconductor circuits is, for example, carried out at different temperatures. For example, the semiconductor circuits are introduced into a furnace or a cooling chamber.

The automatic test machine, for instance, has a multiplicity of outputs and generates, at a respective one of the outputs, a test voltage that can be predefined by a test program.

In each case, one of the multiplicity of semiconductor circuits, for example, includes a generator circuit with a reference terminal for applying a reference potential, an input for applying an input voltage referred to the reference potential, an output for tapping off an output voltage referred to the reference potential, a terminal for predefining a value of a reference voltage for setting the output voltage, and a protection circuit connected between the output and the reference terminal.

Connecting the multiplicity of semiconductor circuits to the automatic test machine, for example, includes connecting the terminals for predefining the value of the reference voltage to one of the multiplicity of outputs of the automatic test machine.

Switching the protection circuit to the conducting state, for example, includes switching a switching element of the protection circuit to the conducting state. The switching element is connected between the output and the reference terminal.

The automatic test machine, for example, has a multiplicity of inputs and varies the value of a test voltage generated at one of the outputs in a manner dependent on the test program and the value of a measurement voltage present at one of the inputs.

BRIEF DESCRIPTION OF THE DRAWINGS

The invention is explained in more detail below based on the basis of the exemplary embodiments illustrated in the drawings.

FIG. 1 shows a generator circuit for generating an internal voltage level required for operation of an integrated semiconductor circuit, and a protection circuit for limiting the voltage level.

DETAILED DESCRIPTION

Figure 2A:
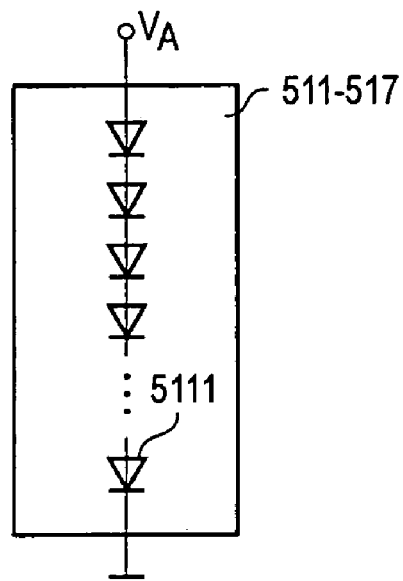
FIGS. 2A–2C show three exemplary embodiments for the protection circuit.

FIG. 1 illustrates a generator circuit 501 to 507 for generating an internal voltage level $V_A$ required for operation of an integrated semiconductor circuit, and a protection circuit 511 to 517 for limiting the internal voltage level $V_A$ to a predefined tolerance range. The generator circuit 501 to 507 includes an input 521 to which an input voltage $V_E$ is applied, an output 522 at which the generator circuit 501 to 507 generates the output voltage $V_A$, and a reference terminal 523 connected to reference potential or ground. The generator circuit 501 to 507 further includes a terminal 524 for predefining a test voltage $V_R$, to which the output voltage $V_A$ generated at the output 522 is adapted by a comparison circuit 52 for test purposes. The generator circuit 501 to 507 also includes the voltage generator 53. The voltage generator 53 increases or decreases the output voltage $V_A$ relative to the input voltage $V_E$ and is, for example, a voltage pump 53. Such a voltage pump 53 has, for example, an output capacitor connected between the output 522 and the reference terminal 523, a charge reversal capacitor and a clock-controlled switching logic, which alternately connects the charge reversal capacitor between the input 521 and the reference terminal 523 in a charging clock and alternately connects the charge reversal capacitor connected between the input 521 and the output 522 in a discharging clock. The terminal of the charge reversal capacitor connected to the input 521 in the charging clock is connected to the output 522 in the discharging clock and that terminal of the charge reversal capacitor connected to the reference terminal 523 in the charging clock is connected to the input 521 in the discharging clock, or in parallel with the output capacitor. The terminal of the charge reversal capacitor connected to the input 521 in the charging clock is connected to the reference terminal 523 in the discharging clock and that terminal of the charge reversal capacitor connected to the reference terminal 523 in the charging clock is connected to the output 522 in the discharging clock. In the first case, the voltage pump generates at the output 522 an output voltage $V_A$ which is almost twice as high as the input voltage $V_E$ present at the input 521 and is unidirectional with respect to the input voltage. In the second case, the voltage pump generates at the output 522 an output voltage $V_A$ which is almost as high as the input voltage $V_E$ present at the input 521 and is directed oppositely with respect to the input voltage. In this case, if the voltage generator 53 is a voltage pump, the feedback loop 531 (FIG. 1) regulates cyclically generating the increased or decreased output voltage $V_A$.

The generator circuit has a feedback path 531, which provides feedback from the output 522 of the generator circuit to an input 532. The input 532 forms an input of the generator circuit. The signal present at the input 532 of the generator circuit controls the output voltage $V_A$ thereof at the terminal 522. The control is effected in addition to the control of the output voltage $V_A$ by the control signal $V_R$ and is superposed on the aforesaid control by the control signal $V_R$. The generator circuit 501 is thus a regulated generator circuit by virtue of a feedback path feeding an output signal A of the generator circuit back to the input side thereof. If the feedback loop 531 has a negative feedback character, the output voltage $V_A$ is corrected to an as far as possible constant value. If the input voltage $V_E$ then rises unexpectedly high, a largely constant output voltage $V_A$ is provided on account of the internal regulating loop of the generator circuit 501 and could stress circuits that are connected downstream to a particularly great extent. Specifically, the input 532 is an input of the voltage generator 53.

The protection circuit 511 to 517 for limiting the output voltage $V_A$ of the generator circuit 501 to 507 is connected between the output 522 of the generator circuit 501 to 507 and the reference terminal 523 of the generator circuit 501 to 507.

The arrangement described includes a generator circuit 501 to 507 for generating an internal voltage level and a protection circuit 511 to 517 for limiting the internal voltage level is used, for example, in dynamic semiconductor memories with random access. In this case, a supply voltage $V_{DD}$ of 3.3 V applied externally to the semiconductor memory or an internal supply voltage $V_{INT}$ of 2.5 V generated by an additional generator circuit is applied to the input 521 of the semiconductor memory. Furthermore, one of the internal voltage levels $V_{PP}$ of 3.5 V, $V_{INT}$ of 2.5 V, $V_{BLH}$ of 1.8 V, $V_{BLEQ}$ of 0.9 V, $V_{PL}$ of 0.9 V, $V_{NWL}$ of −0.5 V or $V_{BB}$ of −1.3 V is generated at the output 522. The significance of the voltage levels for the operation of the semiconductor memory will be clarified with reference to FIG. 3.

Figure 2B:
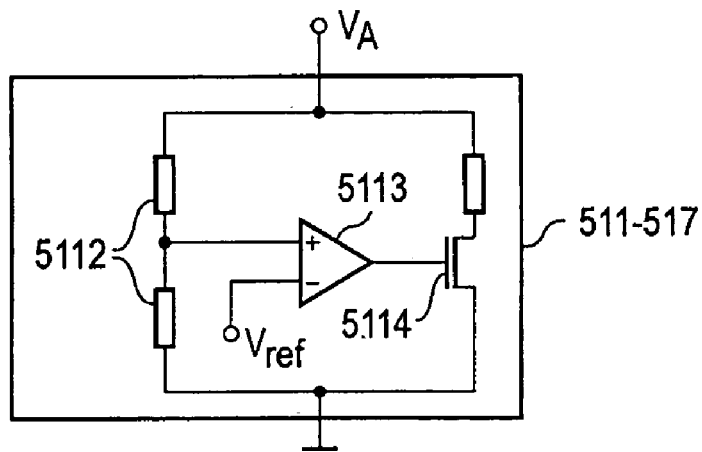
Figure 2C:
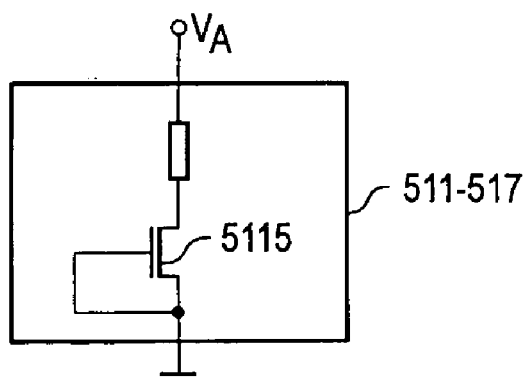

FIGS. 2A, 2B and 2C show three exemplary embodiments of the protection circuit 511 to 517 for limiting the output voltage $V_A$ of the generator circuit 501 to 507. In the case of the first exemplary embodiment (A), the protection circuit 511 to 517 have only a single current path with a number of series-connected diodes 5111. A part of the internal voltage level $V_A$ is dropped across each of the diodes 5111 between a terminal for the internal voltage level $V_A$ and a terminal for the reference potential. If the internal voltage level $V_A$ increases, then the voltage drop across each of the diodes 5111 also increases. If, for one of the diodes 5111, the voltage drop becomes greater than the threshold voltage, the one of the diodes 5111 is turned on. As a result, the voltage drop for each of the remaining diodes 5111 increases. If the threshold voltages of the diodes 5111 of the series circuit do not differ very much, all of the diodes 5111 of the series circuit are thus turned on simultaneously. This means that the resistance of the protection circuit 511 to 517 decreases greatly if the internal voltage level $V_A$ exceeds a threshold voltage corresponding to the sum of the threshold voltages of the diodes 5111. The illustrated series circuit of diodes 5111 is provided for limiting a positive internal voltage level $V_A$. For limiting a negative internal voltage level $V_A$ it is necessary to reverse the polarity of the diodes 5111.

In the case of the second exemplary embodiment (B), the protection circuit 511 to 517 includes a voltage divider 5112 connected between the terminal for the internal voltage level $V_A$ and the terminal for the reference potential with a tapping terminal, an operational amplifier with a first input connected to the tapping resistor of the voltage divider, a second input connected to a predefined reference voltage $V_{ref}$, and an output, and a field effect transistor 5114 with a control terminal, connected to the output of the operational amplifier and a controlled path by which a low-impedance current path between the terminal for the internal voltage level $V_A$ and the terminal for the reference potential is switched to the conducting state. The operational amplifier 5113 operates as a comparator and compares the voltage tapped off at the tapping terminal of the voltage divider 5112 with the predefined reference voltage $V_{ref}$. If the voltage tapped off at the tapping terminal of the voltage divider 5112 is greater than the defined reference voltage $V_{ref}$, then the operational amplifier 5113 generates a positive voltage at its output. If the voltage tapped off at the tapping terminal of the voltage divider 5112 is less than the defined reference voltage $V_{ref}$, then the operational amplifier 5113 generates a negative voltage at its output. If the field effect transistor 5114 is of the n-channel type, then the protection circuit illustrated limits positive internal voltage levels $V_A$. If the field effect transistor 5114 is of the p-channel type, then the circuit is provided for limiting a negative internal voltage level $V_A$. However, a field effect transistor of the respective other channel types if the noninverting terminal of the operational amplifier 5113 is interchanged with the inverting terminal of the operational amplifier 5113, can be used.

In the case of the third exemplary embodiment (C) of the protection circuit 511 to 517, the protection circuit includes a single current path into which the controlled path of a field effect transistor 5115 between the terminal for the internal voltage level $V_A$ and the terminal for the reference potential. In this case, the control terminal is connected to a terminal of the source-drain path connected to the reference potential. In this circuit arrangement, the field effect transistor 5115 is operated as a breakdown diode. The breakdown voltage depends on the channel width of the field effect transistor 5115. The channel type of the field effect transistor 5115 is either n-conducting or p-conducting depending on whether the internal voltage level $V_A$ to be limited is positive or negative.

With the exemplary embodiments illustrated and described for the protection circuit 511 to 517, a positive internal voltage level $V_A$ is limited to avoid exceeding an upper limit value, and a negative internal voltage level is limited to avoid undershooting a lower limit value by an additional low-impedance current path being switched to the conducting state.

The additional power consumption of the protection circuit 511 to 517 triggered by the low-impedance current path being switched to the conducting state increases the power consumption of the generator circuit 501 to 507 and the integrated semiconductor circuit in which the generator circuit is used. This property of the integrated semiconductor circuit equipped with a generator circuit 501 to 507 and a protection circuit 511 to 517 is used in a method for testing the integrated semiconductor circuit, described with reference to FIGS. 5A and 5B.

Figure 3:
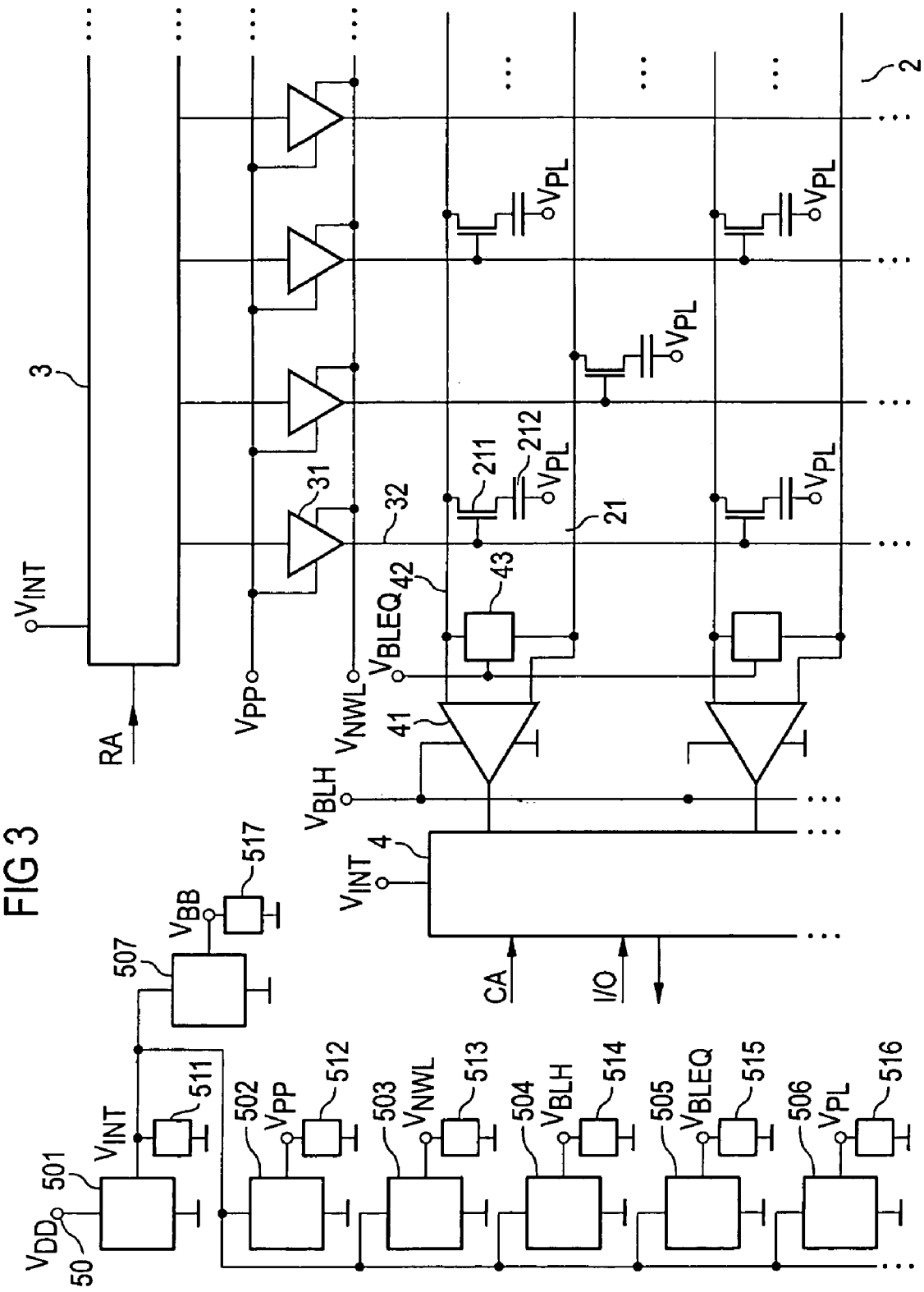
FIG. 3 shows subcircuits of a dynamic semiconductor memory with direct access which are to be supplied with particular internal voltage levels, the generator circuits required for generating the internal voltage levels, and the associated protection circuits.

FIG. 3 illustrates the access logic of a dynamic semiconductor memory with random access and the voltage supply for the access logic. The dynamic semiconductor memory with random access permits access to a memory cell 21 based on an address. Since the memory cells of the memory cell array 2 of the semiconductor memory are arranged two-dimensionally, in rows and columns, the address of the memory cell 21 applied externally to the semiconductor memory is first divided into a row address RA for selection of a row and into a column address CA for selection of a column. The memory cells of one of the rows of the memory cell array 2 are connected to a word line and the memory cells of a column of the memory cell array are connected to a bit line. For example, the memory cell 21 is connected to the word line 32 and the bit line 42. As a result, the memory cell 21 is selected by simultaneous selection of the word line 32 and the bit line 42. Each word line is connected to a word line driver. For example, the word line 32 is connected to the word line driver 31. The switch-off voltage $V_{NWL}$ of −0.5 V is applied as a bias voltage to the word lines via the word line drivers. However, if the word line 32, for example, is selected by the word line decoder 3 based on the row address RA, then the word line driver 31 applies the switch-on voltage $V_{PP}$ to the word line 32. Prior to selection of the word line, the voltages of two adjacent bit lines which are connected to a common equalize circuit, for example, the equalize circuit 43, are matched to a predefined voltage $V_{BLEQ}$. The same two bit lines are connected to a common sense amplifier 41. If the switch-on voltage $V_{PP}$ is applied, for example, to the word line 32 by the word line driver 31, then the controlled path of the selection transistor 211 of the memory cell 21 is switched to the conducting state and charge flows between the electrode 2121 of the storage capacitor 212 connected to the controlled path and the bit line 42. The voltage difference between two bit lines connected to the sense amplifier 41 brought about by this charge flow is detected by the sense amplifier and the sense amplifier 41 applies the high voltage of the bit line $V_{BLH}$ to the one of the two lines with the higher voltage, and applies the reference potential $V_{SS}$ to the one of the two bit lines with the lower voltage. Since the switch-on voltage of the word line $V_{PP}$ is selected to be greater than the high voltage of the bit line $V_{BLH}$ by more than the threshold voltage of the selection transistor 211, the electrode of the storage capacitor 212 which is connected to the controlled path of the selection transistor 211 receives the full voltage of the bit line 42, even when the sense amplifier 41 applies the high voltage of the bit line $V_{BLH}$ to the bit line 42.

The sense amplifier 41 amplifies the voltage of the one of the two connected bit lines which is associated with the memory cell selected by the word line and forwards the voltage to the bit line decoder. In the bit line decoder 4, the information of one of the bit lines is selected based on the column address CA and output onto the data bus I/O.

The voltage levels required for operation of the semiconductor memory are generated as follows.

First, an internal supply voltage $V_{INT}$ is derived from a supply voltage $V_{DD}$ applied externally to the semiconductor memory by the generator circuit 501. The internal supply voltage $V_{INT}$ is limited by the protection circuit 511. The further internal voltage levels are derived from the internal supply voltage $V_{INT}$. The generator circuit 502 generates the switch-on voltage $V_{PP}$, which is limited by the protection circuit 512. The generator circuit 503 generates the switch-off voltage $V_{NWL}$, which is limited by the protection circuit 513. The generator circuit 504 generates the high voltage of the bit line $V_{BLH}$, which is limited by the protection circuit 514. The generator circuit 505 generates the equalize voltage $V_{BLEQ}$, which is limited by the protection circuit 515. The generator circuit 506 generates the plate voltage $V_{PL}$, which is limited by the protection circuit 516. The generator circuit 507 generates the substrate bias voltage $V_{BB}$, which is limited by the protection circuit 517.

Figure 4:
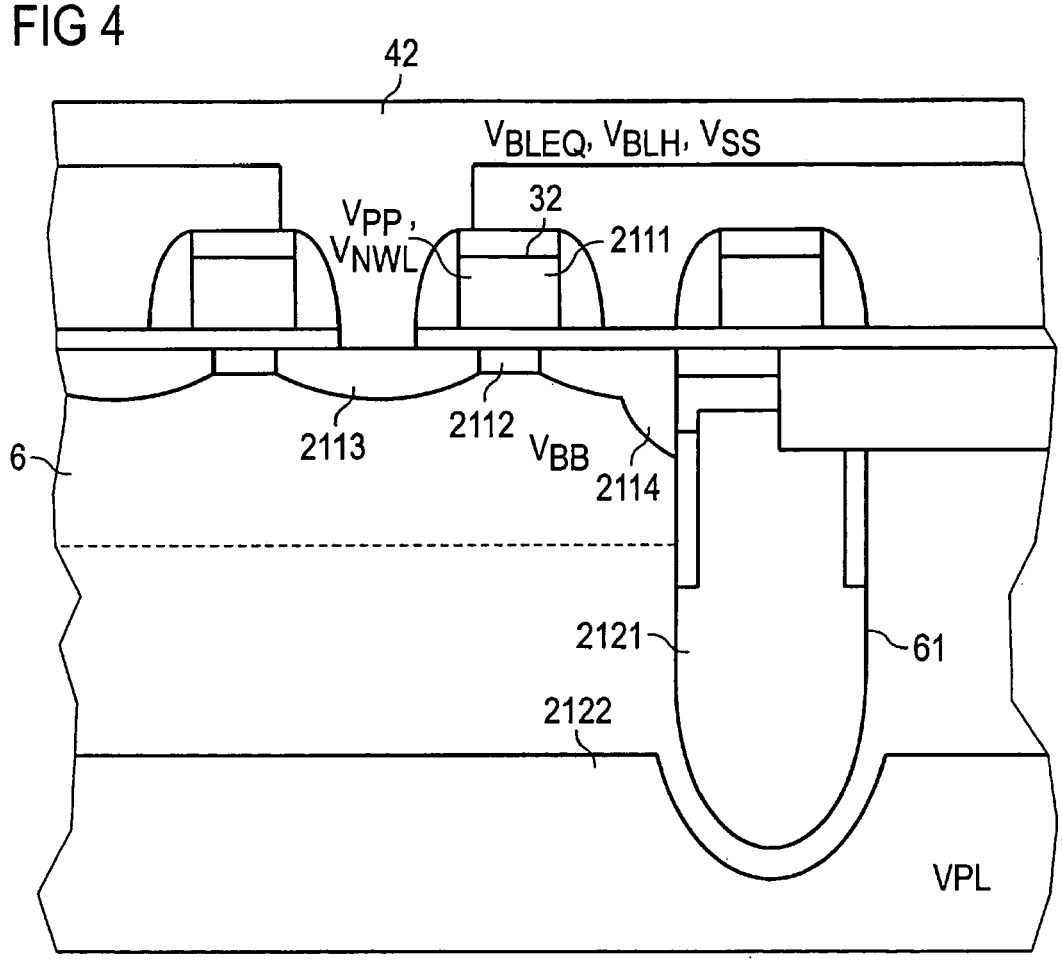
FIG. 4 shows the construction of a memory cell of the dynamic semiconductor memory with direct access and the voltages present at individual structure elements.

FIG. 4 illustrates the construction of a memory cell of the dynamic semiconductor memory with direct access. The internal voltage levels present at the memory cell are also shown. The memory cell includes a selection transistor 211 and a storage capacitor 212. The selection transistor has a gate conductor 2111, a channel 2112 with controllable conductivity, a source region 2113, and a drain region 2114. The storage capacitor includes a first electrode 2121 and a second electrode 2122, which are isolated by a dielectric 61. The construction of the memory cell is based on a substrate 6. The gate conductor 2111 of the selection transistor 211 is formed by the word line 32. The source region 2113 of the selection transistor 211 is connected to the bit line 42. The second electrode 2122 of the storage capacitor 212 is formed as an n-conducting plate in the p-conducting substrate 6 and is connected to the plate voltage $V_{PL}$, which lies approximately between the high voltage $V_{BLH}$ and the reference potential. The substrate 6 is preferably p-conducting and has the negative substrate bias voltage $V_{BB}$ of −1.3 V applied to it in order to suppress undesirable leakage currents between the components and the substrate.

Figure 5A:
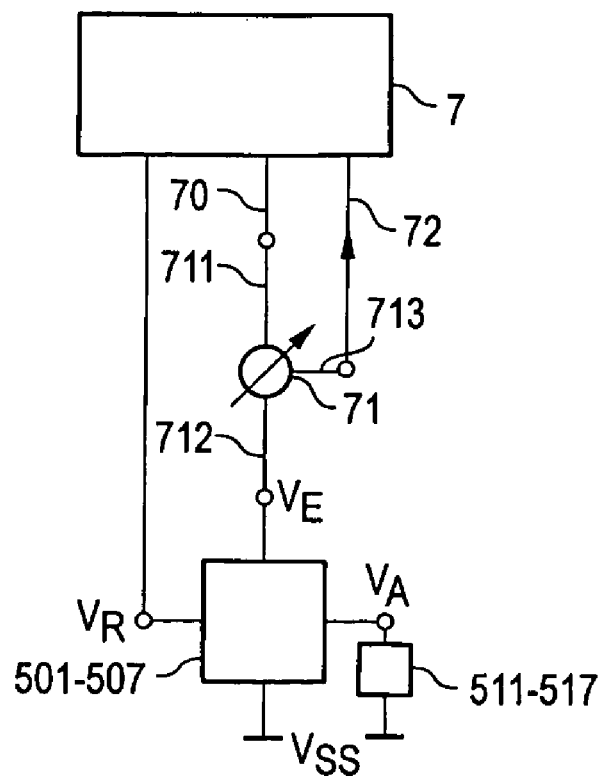
FIGS. 5A and 5B show a generator circuit connected to an automatic test machine, and a flow diagram of a method for carrying out a functional test with altered internal voltage levels for a multiplicity of integrated semiconductor circuits, respectively.

FIG. 5A illustrates an apparatus for testing an integrated semiconductor circuit. The apparatus includes the integrated semiconductor circuit with generator circuits 501 to 507 and the protection circuits 511 to 517, an automatic test machine 7, and a measuring device 71. A respective one of protection circuits is connected between the output of a respective one of the generator circuits 501 to 507 and the reference potential.

The automatic test machine 7 predefines a test voltage $V_R$. The output voltage $V_A$ generated by one of the generator circuits 501 to 507 of the integrated semiconductor circuit is adjusted to the test voltage $V_R$. The power consumption of the integrated semiconductor circuit is then determined by the measuring device 71. If the power consumption of the integrated semiconductor circuit determined by the measuring device 71 is greater than an expected value, then this increased power consumption is caused by the fact that the output voltage $V_A$ of the one of the generator circuits 501 to 507 is limited by that one of the protection circuits 511 to 517 connected between the output of the one of the generator circuits 501 to 507. Consequently, by measuring the power consumption of the integrated semiconductor circuit, the test voltage $V_R$ e.g., the reference potential $V_{SS}$ predefined by the automatic test machine 7 is outside a tolerance range predefined by the protection circuit 511 to 517 and, in particular, has an excessively large magnitude.

Figure 5B:
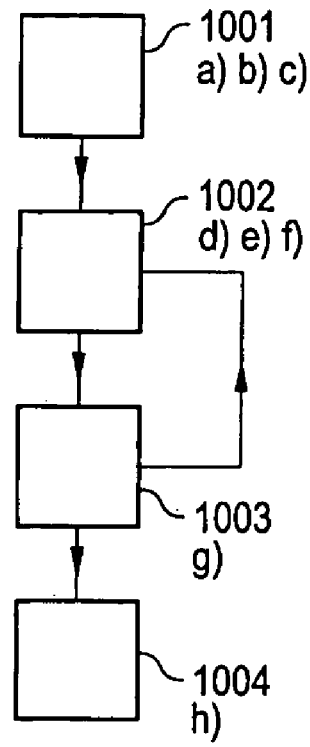

FIG. 5B illustrates a method for testing a multiplicity of integrated semiconductor circuits. The individual steps of the method can be divided into an initialization block 1001 including the successive steps a), b), and c), a loop block 1002 including the successive steps d), e) and f), a termination condition 1003 including step g, and a continuation block 1004 including step h).

In step a), a plurality of semiconductor circuits are provided. In each case, one of the semiconductor circuits has the arrangement of an internal generator circuit 501 to 507 and of an internal protection circuit 511 to 517 which is illustrated in FIG. 1 and has described with reference to FIG. 1. The generator circuit includes the reference terminal 523, the input 521, and the output 522, and the terminal 524 for predefining a value of the reference voltage $V_R$.

In step b), the multiplicity of semiconductor circuits are connected to an automatic test machine. The automatic test machine 7 has a plurality of outputs 70 for predefining a voltage. The terminal for predefining a test voltage $V_R$ of the generator circuit of a respective one of the multiplicity of semiconductor circuits is connected to one of the outputs 70 of the automatic test machine 7. The automatic test machine 7 also has a plurality of inputs 72 for applying a measurement voltage $V_M$. A current measuring device 71 is provided for a respective one of the multiplicity of semiconductor circuits. The current measuring device 71 has a first terminal 711, a second terminal 712, and a third terminal 713. The current measuring device 71 generates a measurement voltage $V_M$ that is proportional, for example to a current I flowing between the first terminal 711 and the second terminal 712 at the third terminal 713. The first terminal 711 of the current measuring device 71 is connected to one of the outputs 70 of the automatic test machine 7. The second terminal 712 of the current measuring device 71 is connected to the integrated semiconductor circuit with the generator circuit 501 to 507 and the protection circuits 511 to 517. The third terminal 513 of the current measuring device 71 is connected to one of the inputs 72 of the automatic test machine 7.

An individually assigned measuring device 71 may be provided for each of the multiplicity of semiconductor circuits. As an alternative, many or all of the multiplicity of semiconductor circuits 501 . . . 507 may be jointly connected to the terminal 712 of a single measuring device 71. The terminals for feeding in the control signal $V_R$ are then also jointly connected to a single output of the automatic test machine 7. In this case, then, the semiconductor circuits 501 to 507 are connected in parallel with regard to their terminals for the signals $V_R$, $V_E$. The measuring device 71 indicates when the power loss consumed by the semiconductor circuits is exceeded. This occurs for example, when the voltage $V_R$ is varied and raises the output voltage $V_A$ to an extent such that the protection circuits 511 to 517 are switched to the conducting state and limit the respective output voltage $V_A$. In the course of this process of varying the control voltage $V_R$ with an increasing magnitude of the output voltage $V_A$, some or a plurality of the protection circuits 511 to 517 are switched to the conducting state and limit the output voltage $V_A$. The power loss consumed thereby rises, which is indicated by the measuring device 71 altogether for the semiconductor circuits. The higher the output voltage $V_A$ is regulated depending on the control signal $V_R$, the more protection circuits 511 to 517 are activated. This indicates to the automatic test machine 7 that the control voltage $V_R$ is set too high, so that the control voltage $V_R$ is subsequently lowered in order that the power loss measured by the measuring device 71 is lowered to an acceptable level again. The output voltage $V_A$ has been limited by the protection circuits 511 to 517 in the meantime, however, so that the function units connected subsequently thereto were not overstressed and a risk that these might be destroyed is avoided. This concept therefore makes it possible to set the control voltage $V_R$ as high as possible and the output voltage $V_A$ as high as possible, so that a highest possible voltage and thus a broad test range can be covered when testing the semiconductor circuits 501 to 507. An overstress and thus inadvertent destruction of function units connected on the output side are avoided, however.

In step c), a test voltage $V_R$ is predefined for a respective one of the multiplicity of semiconductor circuits at the connected outputs 70 of the automatic test machine 7.

In step d), an output voltage $V_A$ that is equal to the test voltage $V_R$ is generated at an output 522 of one of the internal generator circuits 501 to 507 of the multiplicity of semiconductor circuits.

In step e), an additional current path between the output 522 and the reference terminal 523 of the one of the internal generator circuits 501 to 507 is switched to the conducting state if the output voltage $V_A$ is greater than a predefined threshold voltage. The additional current path is switched to the conducting state by a controlled path of the protection circuits 511 to 517 connected between the output 522 and the reference terminal 523 of the one of the internal generator circuits 501 to 507 being switched to the conducting state in a manner dependent on the output voltage $V_A$. The output voltage $V_A$ of the one of the internal generator circuits 501 to 507 is limited as a result of the additional current path being switched to the conducting state.

In step f), the power consumption of a respective one of the multiplicity of semiconductor circuits is measured. For this purpose, the current I flowing through the current measuring device 71 connected to the respective outputs 70 of the automatic test machine is measured and the power consumed by the current measuring device 71 and the respective one of the multiplicity of integrated semiconductor circuits is determined from a voltage predefined at the respective one of the outputs 70 and the current I.

In step g), for those integrated semiconductor circuits of the multiplicity of integrated semiconductor circuits for which a power consumption lying above an expected value is measured, smaller-magnitude values are predefined for the test voltage $V_R$ and steps d) to f) are repeated.

In step h), a functional test is conducted for the multiplicity of semiconductor circuits. The functional test is a burn-in test, for example.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for testing a multiplicity of integrated semiconductor circuits, the method comprising:
    a) providing the multiplicity of integrated semiconductor circuits, each integrated semiconductor circuit having a generator circuit and a protection circuit and an automatic test machine;
    b) connecting the multiplicity of integrated semiconductor circuits to the automatic test machine;
    c) predefining a value of the reference voltage for the multiplicity of semiconductor circuits by the automatic test machine;
    d) generating an output voltage dependent on the value of the reference voltage by a generator circuit of the multiplicity of semiconductor circuits;
    e) switching a current path contained in the protection circuit to the conducting state, if the output voltage exceeds a predetermined threshold value to limit the output voltage of the generator circuit;
    f) measuring a power consumption of the semiconductor circuits;
    g) predefining a smaller-magnitude value of the reference voltage and repeating steps d) to f), if the measured power consumption is greater than a predefined threshold value; and
    h) conducting a functional test for the multiplicity of semiconductor circuits.

2. The method as claimed in claim 1, wherein the functional test is conducted repeatedly at different ambient temperatures.

3. The method as claimed in claim 1, wherein an automatic test machine has a multiplicity of outputs and generates, at a respective one of the outputs, a test voltage predefined by a test program.

4. The method as claimed in claim 3, wherein connecting the multiplicity of semiconductor circuits to the automatic test machine includes connecting the terminal for predefining the value of the reference voltage to one of the multiplicity of outputs of the automatic test machine.

5. The method as claimed in claim 4, wherein the terminals for predefining the value of the reference voltage are connected to a common output of the automatic test machine.

6. The method as claimed in claim 4, wherein switching the current path to the conducting state includes activating a switching element of the protection circuit connected between the output and the reference terminal.

7. The method as claimed in claim 1, wherein the automatic test machine has a multiplicity of inputs and varies the value of a test voltage generated at one of the outputs in a manner dependent on the test program and the value of a measurement voltage present at one of the inputs.

8. The method as claimed in claim 6, the method further comprising:
connecting a current measuring device to one of the outputs of the automatic test machine by a first terminal, the current measuring device being connected to each of the multiplicity of integrated semiconductor circuits by a second terminal, the current measuring being connected to one of the inputs of the automatic test machine by a third terminal, the current measuring device generating a measurement voltage dependent on a current flowing between the first terminal and the second terminal at the third terminal.

9. The method as claimed in claim 7, wherein generating an output voltage corresponding to the predefined voltage value includes comparing a value of the output voltage with the predefined voltage value, whereby a comparison result is determined, and tracking the output voltage in a manner dependent on the comparison result.

* * * * *